US012563662B2

(12) United States Patent
Bai et al.

(10) Patent No.: US 12,563,662 B2
(45) Date of Patent: Feb. 24, 2026

(54) CIRCUIT BOARD AND ELECTRONIC DEVICE

(71) Applicant: HONOR DEVICE CO., LTD., Shenzhen (CN)

(72) Inventors: Puwei Bai, Shenzhen (CN); Haojie Li, Shenzhen (CN)

(73) Assignee: Honor Device Co., Ltd., Shenzhen (CN)

( * ) Notice: Subject to any disclaimer, the term of this patent is extended or adjusted under 35 U.S.C. 154(b) by 0 days.

(21) Appl. No.: 18/040,029

(22) PCT Filed: Sep. 8, 2022

(86) PCT No.: PCT/CN2022/117888
§ 371 (c)(1),
(2) Date: Jan. 31, 2023

(87) PCT Pub. No.: WO2023/071545
PCT Pub. Date: May 4, 2023

(65) Prior Publication Data
US 2024/0260172 A1      Aug. 1, 2024

(30) Foreign Application Priority Data
Oct. 27, 2021    (CN) .......................... 202111255292.X

(51) Int. Cl.
*H05K 1/02*       (2006.01)
*H05K 1/09*       (2006.01)
(Continued)

(52) U.S. Cl.
CPC ......... *H05K 1/0245* (2013.01); *H05K 1/0218* (2013.01); *H05K 1/0225* (2013.01);
(Continued)

(58) Field of Classification Search
CPC .............. H05K 1/0245; H05K 1/0225; H05K 2201/09254; H05K 2201/093;
(Continued)

(56) References Cited

U.S. PATENT DOCUMENTS 7,812,693  B1    10/2010  Acimovic
8,283,571  B2    10/2012  Lai et al.
(Continued)

FOREIGN PATENT DOCUMENTS

CN        101277593  A      10/2008
CN        101472388  A       7/2009
(Continued)

*Primary Examiner* — Ishwarbhai B Patel
(74) *Attorney, Agent, or Firm* — Fish & Richardson P.C.

(57)        ABSTRACT

A circuit board and an electronic device is provided. The circuit board includes: a signal layer, where the signal layer includes at least one set of differential wires, and the at least one set of differential wires includes a first differential wire and a second differential wire that are insulated from each other; the first differential wire includes a first part, a second part, and a third part that are arranged successively in an extension direction of the first differential wire; and the second differential wire includes a fourth part, a fifth part, and a sixth part that are arranged successively in an extension direction of the second differential wire; and a ground plane, where the ground plane is disposed on at least one side of the signal layer, and is insulated from the signal layer; and the ground plane is provided with a first hollowed-out portion.

10 Claims, 9 Drawing Sheets

X direction

(51) Int. Cl.
    *H05K 1/18*            (2006.01)
    *H05K 1/181*         (2026.01)

(52) U.S. Cl.
    CPC ........... *H05K 1/024* (2013.01); *H05K 1/0253*
        (2013.01); *H05K 1/18* (2013.01); *H05K 1/181*
        (2013.01); *H05K 2201/09254* (2013.01); *H05K*
        *2201/093* (2013.01); *H05K 2201/10098*
        (2013.01); *H05K 2201/10121* (2013.01)

(58) Field of Classification Search
    CPC .......... H05K 2201/10098; H05K 2201/10121;
        H05K 1/0253; H05K 2201/09236; H05K
        2201/0969; H05K 1/0218; H01P 3/026
    See application file for complete search history.

(56)         References Cited

U.S. PATENT DOCUMENTS

| | | | |
|---|---|---|---|
| 9,241,400 B2 * | 1/2016 | Shaw | H05K 1/0253 |
| 11,183,766 B2 | 11/2021 | Jia | |
| 2004/0000959 A1 | 1/2004 | Howard et al. | |
| 2006/0055484 A1 | 3/2006 | Miller | |
| 2006/0237322 A1 | 10/2006 | Hsu | |
| 2007/0222052 A1 | 9/2007 | Kabumoto | |
| 2009/0260860 A1 | 10/2009 | Pai et al. | |
| 2010/0052820 A1 * | 3/2010 | Wu | H01P 1/20336 |
| | | | 333/204 |
| 2015/0319847 A1 | 11/2015 | Kim et al. | |
| 2017/0264260 A1 | 9/2017 | Fukuchi | |
| 2019/0166685 A1 * | 5/2019 | Lee | H01L 21/563 |
| 2020/0321672 A1 | 10/2020 | Kopp | |
| 2020/0343636 A1 | 10/2020 | Nikolayenkov et al. | |

FOREIGN PATENT DOCUMENTS

| | | | |
|---|---|---|---|
| CN | 101562939 A | | 10/2009 |
| CN | 201436831 U | | 4/2010 |
| CN | 102238803 A | | 11/2011 |
| CN | 102264188 A | | 11/2011 |
| CN | 103906350 A | | 7/2014 |
| CN | 104244574 A | | 12/2014 |
| CN | 105611718 A | | 5/2016 |
| CN | 105873356 A | | 8/2016 |
| CN | 111372371 A | * | 7/2020 |
| CN | 211125997 U | | 7/2020 |
| CN | 111834731 A | | 10/2020 |
| CN | 115023026 A | | 9/2022 |
| JP | 2012074901 A | | 4/2012 |
| JP | 2017220635 A | | 12/2017 |
| TW | I291848 B | | 12/2007 |
| TW | 201143558 A | | 12/2011 |
| WO | 2010103722 A1 | | 9/2010 |

\* cited by examiner

X direction

X direction

A1-A2

B1-B2

D1-D2

Frequency (GHz)

CIRCUIT BOARD AND ELECTRONIC DEVICE

CROSS-REFERENCE TO RELATED APPLICATIONS

This application is a national stage of International Application No. PCT/CN2022/117888, filed on Sep. 8, 2022, which claims priority to Chinese Patent Application No. 202111255292.X filed on Oct. 27, 2021. Both of the aforementioned applications are hereby incorporated by reference in their entireties.

TECHNICAL FIELD

This application relates to the field of signal transmission technologies, and in particular, to a circuit board and an electronic device.

BACKGROUND

An electronic device includes modules such as a display and a camera. A system on chip (system on chip, SoC) transmits and receives signals by using modules such as the display and the camera to enable the display and the camera to implement their respective functions.

Using that the camera sends signals to the SoC as an example, the signals sent by the camera to the SoC may include differential signals. In addition to the differential signals, the signals sent by the camera to the SoC may also carry common mode signals. If a path for transmitting a differential signal by the camera to the SoC is close to an antenna, a harmonic component of a common mode signal carried in the signal transmitted by the camera to the SoC will interfere with the antenna.

SUMMARY

To resolve the foregoing technical problem, this application provides a circuit board and an electronic device, to attenuate a common mode signal on a differential wire without affecting normal transmission of a differential signal, so as to reduce impact on an antenna close to the differential wire. In addition, in this application, a process of attenuating the common mode signal is implemented by forming a first hollowed-out portion on an existing ground plane, so as to avoid additional increase of total power consumption, layout area, and design complexity of the circuit board.

According to a first aspect, this application provides a circuit board, including a signal layer and a ground plane that are laminated and insulated from each other. The signal layer includes at least one set of differential wires, and each set of differential wires includes a first differential wire and a second differential wire. The first differential wire includes a first part, a second part, and a third part that are arranged successively in an extension direction of the first differential wire. The second differential wire includes a fourth part, a fifth part, and a sixth part that are arranged successively in an extension direction of the second differential wire. The ground plane is disposed on at least one side of the signal layer, the ground plane is provided with a first hollowed-out portion, and an orthographic projection of the first hollowed-out portion on the signal layer overlaps with the second part and the fifth part.

In this application, by adding the ground plane, a voltage of the ground plane is different from common mode voltages of common mode signals transmitted over all first differential wires and common mode voltages of common mode signals transmitted over all second differential wires. Therefore, the common mode signals transmitted over all first differential wires and the common mode signals transmitted over all second differential wires may use the ground plane as a reference, and the ground plane forms capacitance with all first differential wires and all second differential wires, respectively. Alternating current common mode signals may be coupled based on the capacitance. All first differential wires and all second differential wires may also couple some common mode signals to parts that are of the ground plane and that overlap with the first differential wires and the second differential wires in the form of a current while transmitting first differential signals, second differential signals, and common mode signals. Due to existence of the first hollowed-out portion, a part that is of the second part and that is corresponding to the first hollowed-out portion and a part that is of the fifth part and that is corresponding to the first hollowed-out portion cannot form capacitance with the first hollowed-out portion, so that parasitic capacitance of the part that is of the second part and that is corresponding to the first hollowed-out portion is reduced, and parasitic capacitance of the part that is of the fifth part and that is corresponding to the first hollowed-out portion is reduced. In addition, common mode signals transmitted to parts that are of the second part and the fifth part and that are corresponding to the first hollowed-out portion cannot be directly coupled to the ground plane in a direction perpendicular to the ground plane with a shortest path, but need to be bypassed to the first part and the fourth part before being coupled to the ground plane. In this way, parasitic inductance of the parts that are of the second part and the fifth part and that are corresponding to the first hollowed-out portion is increased. Because the parasitic capacitance is reduced and the parasitic inductance is increased, characteristic impedance R of the second part and the fifth part with respect to the ground plane is increased compared with characteristic impedance R of the first part and the fourth part with respect to the ground plane. As a result, characteristic impedance of a part that is from the first part to the second part and that is corresponding to the first hollowed-out portion changes abruptly, and characteristic impedance of a part that is from the fourth part to the fifth part and that is corresponding to the first hollowed-out portion changes abruptly. Because the characteristic impedance changes abruptly, at least some common mode signals are reflected at parts that are of the first differential wire and the second differential wire and that are corresponding to the first hollowed-out portion. That is, at least some common mode signals are transmitted to a part corresponding to the first hollowed-out portion over the first differential wire and the second differential wire, and then flow back in an opposite direction over the first differential wire and the second differential wire. In this way, a quantity of common mode signals transmitted from the second part to the third part is reduced, and a quantity of common mode signals transmitted from the fifth part to the sixth part is reduced. In other words, a common mode signal at a target frequency is attenuated along a transmission path thereof, so that impact on an antenna close to the first differential wire and the second differential wire is reduced. In addition, compared with addition of a common mode choke component to a mainboard in the related technology, in this application, a process of attenuating the common mode signal is implemented by forming a first hollowed-out portion on an existing ground plane, so as to avoid additional increase of total power consumption, layout area, and design complexity of the circuit board.

In addition, for differential signals, a first differential voltage of a first differential signal and a second differential voltage of a second differential signal in a set of differential signals are different, and the first differential voltage and the second differential voltage may refer to each other. Therefore, first differential signals transmitted over all first differential wires and second differential signals transmitted over all second differential wires have weak impact on the ground plane, the first differential signals and the second differential signals are less affected by the first hollowed-out portion, and the first differential wires and the second differential wires can still transmit differential signals to an SoC normally, so that normal transmission of the differential signals is not affected.

In some possible implementations, a width of the first hollowed-out portion is a ratio of a wavelength at a target frequency to 4 in the extension direction of the first differential wire and the extension direction of the second differential wire, and the target frequency is a frequency of a common mode signal attenuated by the circuit board, so as to attenuate a common mode signal at the target frequency to a maximum extent.

In some possible implementations, the orthographic projection of the first hollowed-out portion on the signal layer completely overlaps with the second part and the fifth part. Compared with a situation in which an orthographic projection of the first hollowed-out portion on the signal layer covers a part of the second part and a part of the fifth part, in an embodiment of this application, when an orthographic projection of the first hollowed-out portion on the signal layer completely covers the second part and the fifth part, characteristic impedance of the second part and the fifth part with respect to the ground plane may be increased, so that more common mode signals can flow back over the first differential wire and the second differential wire in an opposite direction to attenuate common mode signals at a target frequency or target band to a greater extent.

In some possible implementations, the ground plane is further provided with a second hollowed-out portion and a third hollowed-out portion; an orthographic projection of the second hollowed-out portion on the signal layer is located on one side that is of the first differential wire and that is away from the second differential wire; an orthographic projection of the third hollowed-out portion on the signal layer is located on one side that is of the second differential wire and that is away from the first differential wire; and the first hollowed-out portion, the second hollowed-out portion and the third hollowed-out portion continuously penetrate through the ground plane; and the ground plane is enclosed by the first hollowed-out portion, the second hollowed-out portion and the third hollowed-out portion into a first branch and a second branch, and the first branch and the second branch are respectively disposed on opposite sides of the first hollowed-out portion; and an edge of the first branch and an edge of the second branch are flush with edges of the second hollowed-out portion and the third hollowed-out portion. On this basis, an extension direction of the second hollowed-out portion is the same as that of the first differential wire, and an extension direction of the third hollowed-out portion is the same as that of the second differential wire.

Due to existence of a second hollowed-out area and a third hollowed-out area, after receiving common mode signals coupled by the first differential wire and the second differential wire, parts that are of the ground plane and that are directly opposite to the first differential wire and the second differential wire can no longer couple alternating current common mode signals to a part that is of the ground plane and that is adjacent to the signal layer in the form of a current based on a capacitive coupling effect, so that parasitic capacitance of the first part and the fourth part with respect to the ground plane is reduced. In addition, compared with a situation in which the ground plane does not include the second hollowed-out portion and the third hollowed-out portion, common mode signals transmitted along side faces of the first differential wire and the second differential wire cannot be fully coupled to the ground plane due to existence of the second hollowed-out portion and the third hollowed-out portion. In other words, due to existence of the second hollowed-out portion and the third hollowed-out portion, a coupling area between the first differential wire and the ground plane and a coupling area between the second differential wire and the ground plane are reduced. As the coupling area between the first differential wire and the ground plane and the coupling area between the second differential wire and the ground plane are reduced, parasitic capacitance of the first part and the fourth part with respect to the ground plane is also reduced. Because parasitic capacitance of the first part and the fourth part at the second hollowed-out portion and the third hollowed-out portion with respect to the ground plane is reduced, characteristic impedance of parts that are of the first part and the fourth part and that are directly opposite to the first branch is increased, resulting in an abrupt change in characteristic impedance of parts that are of the first part and the fourth part and that are directly opposite to the first branch. At least some common mode signals are transmitted to the parts directly opposite to the first branch over the first differential wire and the second differential wire, and then flow back in an opposite direction over the first differential wire and the second differential wire. Similarly, at least some common mode signals are transmitted to the parts directly opposite to the second branch over the first differential wire and the second differential wire, and then flow back in an opposite direction over the first differential wire and the second differential wire. In this way, the common mode signals are attenuated along transmission paths thereof, so that impact on an antenna close to the first differential wire and the second differential wire is reduced.

In some possible implementations, the first branch and the second branch include protrusions, and the protrusions protrude in a vertical direction between the first differential wire and the second differential wire. Compared with a solution in which the first branch and the second branch do not include the protrusions, a length of the first branch and a length of the second branch may be increased without changing a vertical distance between the first branch and the first hollowed-out portion or a vertical distance between the second branch and the first hollowed-out portion, so that a common mode signal at a lower frequency or band can be attenuated.

In some possible implementations, a length range of the first branch and the second branch is a ratio of a wavelength at a target frequency to 4, so as to attenuate a common mode signal at the target frequency to a maximum extent. The length of the first branch is a length from an edge that is of the first branch and that is away from the second branch to the first hollowed-out portion, the length of the second branch is a length from an edge that is of the second branch and that is away from the first branch to the first hollowed-out portion, and the target frequency is a frequency of a common mode signal attenuated by the circuit board.

In some possible implementations, in a vertical direction between the first differential wire and the second differential wire, edges of an area where orthographic projections of the first branch and the second branch on the signal layer are located go beyond edges of the first differential wire and the second differential wire, so as to avoid overlapping areas between orthographic projections of the second hollowed-out portion and the third hollowed-out portion on the signal layer and the first differential wire and the second differential wire due to an alignment error in a process.

In some possible implementations, a quantity of the ground plane is two, and the two ground planes are respectively disposed on opposite sides of the signal layer. In this way, a common mode signal at a target frequency or target band may be further attenuated, so as to further reduce impact on an antenna close to the first differential wire and the second differential wire.

In some possible implementations, at least one chip is integrated on the circuit board, and the chip includes the signal layer. On this basis, the chip further includes a ground plane. The signal layer and the ground plane may be a part of the chip, or may be a part of the circuit board.

According to a second aspect, an electronic device is provided, including a mainboard and an antenna, where the mainboard includes the circuit board according to the first aspect.

In this application, the electronic device includes the circuit board according to the first aspect. The circuit board may be configured to reduce interference of common mode signals on a differential wire pair to an antenna, so as to enable the antenna to accurately transmit and receive an electromagnetic wave signal, thereby ensuring normal operation of the electronic device. For example, the electronic device may be a mobile phone. By reducing interference of common mode signals on differential wires to an antenna, the mobile phone can operate normally, so as to improve connection quality.

In some possible implementations, the electronic device further includes a camera, an SoC is further integrated on the mainboard, and the camera is coupled with the SoC by using at least one set of differential wires of the circuit board.

In addition, any one of the second aspect or the implementations of the second aspect is corresponding to any one of the first aspect or the implementations of the first aspect. For technical effects corresponding to any one of the third aspect or the implementations of the second aspect, refer to technical effects corresponding to any one of the first aspect or the implementations of the first aspect. Details are not described herein again.

BRIEF DESCRIPTION OF DRAWINGS

FIG. 3 is a schematic sectional view taken along an A1-A2 direction in FIG. 2a;

FIG. 4 is a schematic sectional view taken along a B1-B2 direction in FIG. 2a;

REFERENCE SIGNS

11—Camera; 12—Mainboard; 121—SoC; 13—Flexible printed circuit; 14—Board-to-board connector; 15—Common mode choke component; 16—Antenna; 21—Ground plane; 211—First hollowed-out portion; 212—Second hollowed-out portion; 213—Third hollowed-out portion; 214—First branch; 215—Second branch; 31—First differential wire; 311—First part; 312—Second part; 313—Third part; 32—Second differential wire; 321—Fourth part; 322—Fifth part; and 323—Sixth part.

DESCRIPTION OF EMBODIMENTS

The following clearly and completely describes technical solutions in embodiments of this application with reference to accompanying drawings in the embodiments of this application. Apparently, the described embodiments are some rather than all of the embodiments of this application. Based on the embodiments of this application, all other embodiments obtained by a person of ordinary skill in the art without creative efforts fall within the protection scope of this application.

In this specification, the term "and/or" is only used to describe an association relationship between associated objects, and indicates that three relationships may exist. For example, A and/or B may indicate the following: Only A exists, both A and B exist, and only B exists.

In the specification and claims of this application, the terms "first", "second", "third", "fourth", and the like are intended to distinguish between different objects but do not indicate a particular order of the objects. For example, a first target object and a second target object are used to distinguish between different target objects, and are not used to describe a specific order of the target objects.

In embodiments of this application, the word such as "as an example" or "for example" is used to represent giving an example, an illustration, or a description. In embodiments of this application, any embodiment or design solution described as "as an example" or "for example" shall not be explained as being preferred or advantageous over other embodiments or design solutions. To be precise, the use of the words such as "example" or "for example" is intended to present a related concept in a specific manner.

In the descriptions of the embodiments of this application, unless otherwise specified, "a plurality of" means two or more than two. For example, a plurality of processing units refer to two or more processing units. A plurality of systems refer to two or more systems; and a plurality of systems refer to two or more systems.

Figure 1:
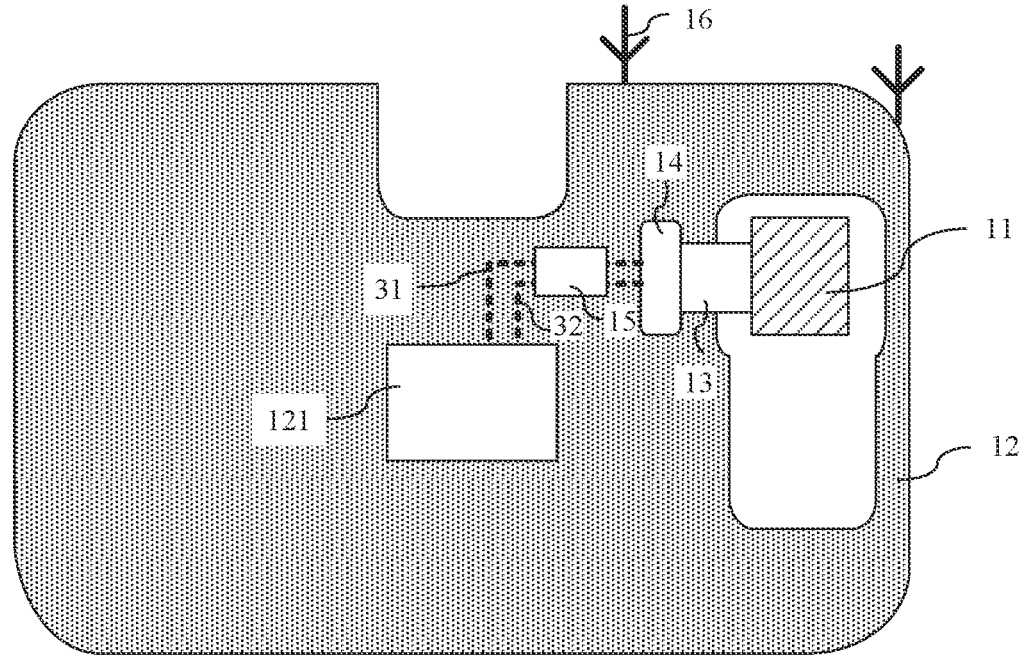
FIG. 1 is a diagram of an example of an application scenario of a circuit board.

An embodiment of this application provides an electronic device, and the electronic device may be an electronic device such as a mobile phone, a tablet computer, a personal digital assistant (personal digital assistant, PDA), a vehicle-mounted computer, a TV set, and a smartwatch. A specific form of the foregoing electronic device is not specifically limited in this embodiment of this application. As shown in FIG. 1, for ease of description, that the electronic device is a mobile phone is used as an example for description.

As shown in FIG. 1, the mobile phone may include a display, a camera 11, a mainboard 12, an antenna 16, and the like.

An SoC 121 is integrated on the mainboard 12, and one or more processing units are integrated in the SoC 121. For example, an application processor (application processor, AP), a modem processor, a graphics processing unit (graphics processing unit, GPU), an image signal processor (image signal processor, ISP), a controller, a memory, a video codec, a digital signal processor (digital signal processor, DSP), a baseband processor, and/or a neural-network processing unit (neural-network processing unit, NPU), and the like are integrated in the SoC 121. Different processing units may be independent components, or may be integrated into one or more processors.

The camera 11 is configured to capture still images or videos, and an optical image is generated for an object by using a lens and is projected to a photosensitive element of the camera. The photosensitive element may be a charge coupled device (charge coupled device, CCD) or a complementary metal-oxide-semiconductor (complementary metal-oxide-semiconductor, CMOS) phototransistor. The photosensitive element converts an optical signal into an electrical signal, and then transfers the electrical signal to the ISP for conversion into a digital image signal. The ISP outputs the digital image signal to the DSP for processing. The DSP converts the digital image signal into an image signal in a standard format such as RGB or YUV. In some embodiments, the electronic device may include one or more cameras 11.

The antenna 16 may include a first antenna and a second antenna, and the first antenna and the second antenna are configured to transmit and receive electromagnetic wave signals. Each antenna 16 in the electronic device may be configured to cover one or more communication bands. Different antennas 16 may also be multiplexed to improve utilization of the antennas 16. For example, the antenna 16 may be multiplexed into a diversity antenna of a wireless local area network. In some other embodiments, the antenna may be used in combination with a tuning switch.

The SoC 121 may send a signal to the camera 11 to control the camera 11 to operate. The camera 11 may also send a signal (such as the foregoing electrical signal) to the SoC 121 through a path including a flexible printed circuit (flexible printed circuit, FPC) 13, a board to board connector (board to board, BTB) 14, and differential wires (a first differential wire 31 and a second differential wire 32) in the mainboard 12, so as to process the electrical signal by using the processing unit in the SoC 121. The electrical signal sent by the camera 11 to the SoC 121 may include a differential signal, and the differential signal may also, for example, be a differential signal of a mobile industry processor interface (mobile industry processor interface, PIMI) or a differential signal of a serializer/deserializer (SERializer/DESerializer, SerDes).

In the conventional technology, when the camera 11 sends a differential signal to the SoC 121, the differential signal may carry a common mode signal. If a transmission path is close to the antenna 16 when the camera 11 sends the differential signal to the SoC 121, and a band of the common mode signal carried in the differential signal sent by the camera to the SoC 121 coincides at least partially with a band of an electromagnetic wave signal transmitted or received by the antenna 16, then a harmonic component of the common mode signal will interfere with an electromagnetic wave transmitted by the antenna 16. As a result, the antenna 16 cannot transmit and receive the electromagnetic wave signal normally, affecting normal operation of the mobile phone.

Based on the foregoing problem, as shown in FIG. 1, in the related technology, an additional common mode choke component 15 is added to the transmission path of the deferential signal and the common mode signal to filter out the carried common mode signal on the transmission path of the differential signal by using the common mode choke component 15. The added common mode choke component 15 may be connected in series to the differential wires to filter out common mode signals transmitted to the differential wires.

However, the common mode choke component 15 also has a strong suppression effect on the differential signal, that is, the common mode choke component 15 will weaken the differential signal that should be transmitted to the SoC 121 while filtering out the common mode signal. In addition, the common mode choke component 15 is an independent component, and the common mode choke component 15 will consume electric energy during operation, resulting in an increase in total power consumption of the mainboard 12. In addition, because the common mode choke component 15 is added to the mainboard 12, a layout area of the mainboard 12 is increased, and integrated circuits in the mainboard 12 are designed to be more dense, so that via holes need to be added in the mainboard 12 to connect circuits and wires in the mainboard 12. As a result, design complexity of the mainboard 12 is increased.

It should be noted here that, in the foregoing description, that the camera sends the differential signal to the SoC 121 is merely used as an example. In this embodiment of this application, a component of the electronic device may also send a differential signal to another component in a path close to the antenna 16, and the differential signal carries a common mode signal, which is not specifically limited in this embodiment of this application. For ease of description, the following describes how the camera 11 sends a differential signal to the SoC 121.

Based on the foregoing description, an embodiment of this application provides a circuit board. A common mode signal at a target frequency or target band is attenuated on a transmission path thereof by forming hollowed-out portions (a first hollowed-out portion, a second hollowed-out portion, and a third hollowed-out portion described below) in a ground plane of the circuit board. In other words, the common mode signal at the target frequency or target band is filtered to improve the problem that the common mode signal interferes with the antenna 16 on the transmission path. When the circuit board is applied to the electronic device, the antenna 16 can accurately transmit and receive electromagnetic wave signals, so as to ensure that the electronic device can operate normally. For example, the electronic device may be a mobile phone. By reducing interference of common mode signals on differential wires to an antenna, the mobile phone can operate normally, so as to improve connection quality. The target frequency or target band may be a frequency or band that coincides with a frequency or band of an electromagnetic signal transmitted or received by the antenna 16.

A structure and a function of the circuit board are described in detail with reference to the electronic device.

Figure 2A:
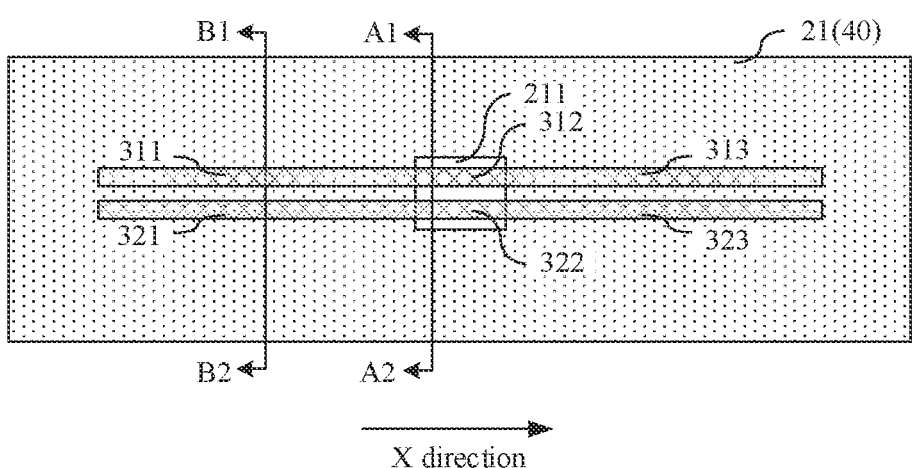
FIG. 2a is a top view of a circuit board according to an embodiment of this application.

In one embodiment, as shown in FIG. 2a to FIG. 4, the circuit board may include a signal layer, and the signal layer includes at least one first differential wire 31 and at least one second differential wire 32 that are insulated from each other. Each first differential wire 31 and a second differential wire 32 form a set of differential pair wires, that is, each first differential wire 31 is corresponding to a second differential wire 32. The first differential wire 31 includes a first part 311, a second part 312, and a third part 313 that are arranged successively in an extension direction of the first differential wire 31. The second differential wire 32 includes a fourth part 321, a fifth part 322, and a sixth part 323 that are arranged successively in an extension direction of the second differential wire 32. In FIG. 2a, that the extension direction of the first differential wire 31 is the same as the extension direction of the second differential wire 32 is merely used as an example. In this embodiment of this application, the extension direction of the first differential wire 31 and the extension direction of the second differential wire 32 may be the same or different. For ease of description, the following description will be made with the extension direction of the first differential wire 31 being the same as the extension direction of the second differential wire 32.

In some possible implementations, the signal layer may only include at least one first differential wire 31 and at least one second differential wire 32. Alternatively, in addition to the at least one first differential wire 31 and the at least one second differential wire 32, the signal layer may further include a structure such as another wire or an electrode, which is not specifically limited in this embodiment of this application.

Still referring to FIG. 2a to FIG. 4, the circuit board may further include a ground plane 21, and the ground plane 21 is disposed on at least one side of the signal layer, and is insulated from both the first differential wire 31 and the second differential wire 32. For example, an insulating layer 40 may be provided between the ground plane 21 and each of the first differential wire 31 and the second differential wire 32, and the signal layer and the ground plane 21 are separated by using the insulating layer 40. The ground plane 21 is provided with a first hollowed-out portion 211, and an orthogonal projection of the first hollowed-out portion 211 on the signal layer overlaps with the second part 312 and the fifth part 322.

Figure 2B:
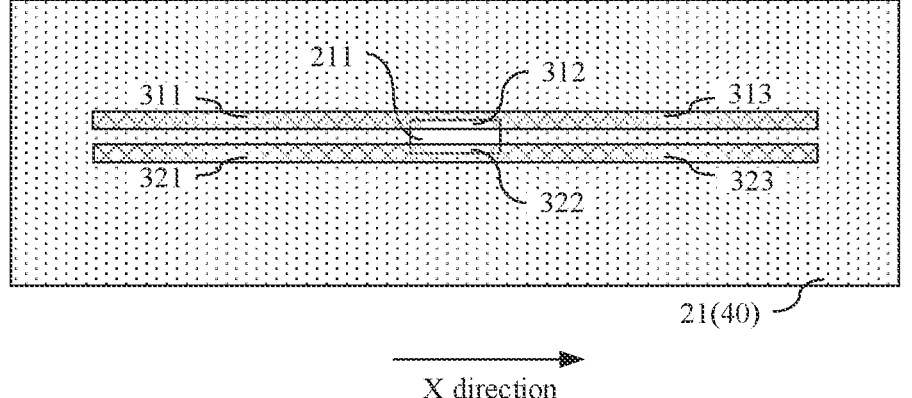
FIG. 2b is a top view of another circuit board according to an embodiment of this application.
Figure 3:
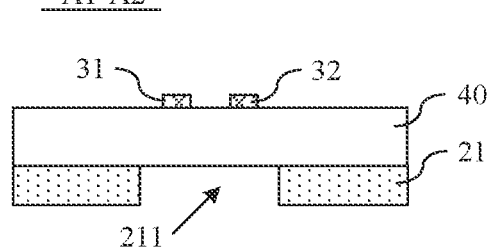
Figure 4:
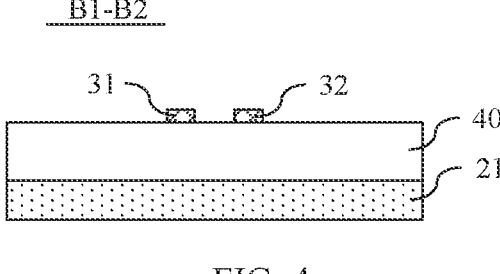

It should be noted herein that the orthogonal projection of the first hollowed-out portion 211 on the signal layer is a projection that the first hollowed-out portion 211 vertically projects onto the signal layer in a vertical direction from the ground plane 21 to the signal layer. In addition, as shown in FIG. 2a, the orthogonal projection of the first hollowed-out portion 211 on the signal layer may completely cover the second part 312 and the fifth part 322; or as shown in FIG. 2b, the orthogonal projection of the first hollowed-out portion 211 on the signal layer covers a part of the second part 312 and a part of the fifth part 322. For ease of description, the part that is of the second part 312 and that is covered by the orthogonal projection of the first hollowed-out portion 211 on the signal layer is hereinafter referred to as a part that is of the second part 312 and that is corresponding to the first hollowed-out portion 211; and the part that is of the fifth part 322 and that is covered by the orthogonal projection of the first hollowed-out portion 211 on the signal layer is hereinafter referred to as a part that is of the fifth part 322 and that is corresponding to the first hollowed-out portion 211.

In some possible implementations, one or more chips may be integrated in the circuit board, and the signal layer may be a part of the chip. Alternatively, the signal layer and the ground plane may be a part of the chip. Alternatively, the signal layer and the ground plane 21 may be membrane layers that directly form the circuit board, except the chip. The circuit board may be a flexible printed circuit (flexible printed circuit, FPC), a printed circuit board (printed circuit board, PCB), or the like.

Figure 5:
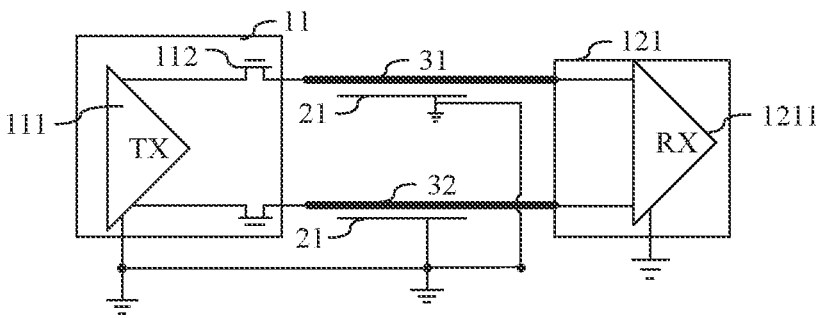
FIG. 5 is a diagram showing a transmission circuit for common mode signals in differential wires.

Based on the structure, that the camera 11 sends differential signals to the SoC 121 is still used as an example, one end of at least one first differential wire 31 and one end of at least one second differential wire 32 are electrically connected to the camera 11 by using an FPC11 and a BTB14, and the other end is electrically connected to the SoC 121. As shown in FIG. 5, a transmitting circuit 111 of the camera 11 may provide driving signal data to a source of a phototransistor 1112, and when being driven by the driving signal data, a drain of the phototransistor 112 may send at least one set of differential signals to a receiving circuit 1211 of the SoC 121 over at least one first differential wire 31 and at least one second differential wire 32. The at least one first differential wire 31 and the at least one second differential wire 32 also transmit alternating current common mode signals while transmitting the at least one set of differential signals.

In some possible implementations, the camera 11 may be wired through at least one set of differential wires, and each set of differential wires includes a first differential wire 31 and a second differential wire 32. The first differential wire 31 and the second differential wire 32 in one set of differential wires may send one set of differential signals to the SoC 121. In this application, a quantity of the first differential wire 31 may be one or more, and a quantity of the second differential wire 32 may be one or more. When there is one first differential wire 31 and one second differential wire 32, the camera 11 may send a set of differential signals to the SoC 121. When there are a plurality of first differential wires 31 and a plurality of second differential wires 32, the camera 11 may send a plurality of sets of differential signals to the SoC 121. For example, there are three first differential wires 31 and three second differential wires 32, and the camera 11 may send three sets of differential signals to the SoC 121.

Each set of differential signals includes a first differential signal and a second differential signal, the first differential signal may be transmitted over the first differential wire 31, and the second differential signal may be transmitted over the second differential wire 32. The first differential wire 31 and the second differential wire 32 in a set of differential signals transmit a common mode signal together. A filtering process of the circuit board in this application is described below with the first differential signal, the second differential signal and the common mode signal being transmitted in an X direction. The X direction is a vertical distance direction from the first part 311 to the second part 312 and a vertical distance direction from the fourth part 321 to the fifth part 322.

Figure 6:
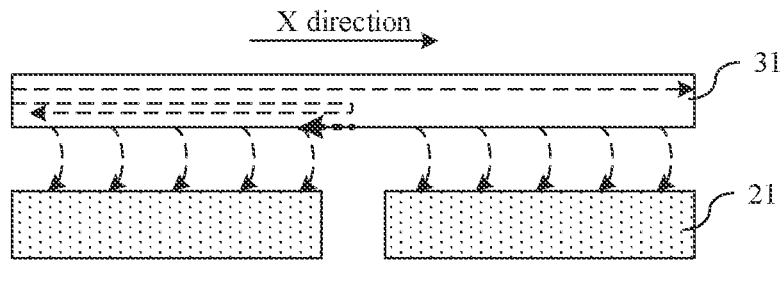
FIG. 6 is a schematic diagram of an example of common mode signals coupled from a signal layer to a ground plane.

For common mode signals, a common mode voltage across the first differential wire 31 is the same as a common mode voltage across the second differential wire 32 when the first differential wire 31 and the second differential wire 32 transmit a common mode signal. Therefore, common mode signals on all first differential wires 31 and common mode signals on second differential wires 32 cannot refer to each other. As shown in FIG. 6, in this application, by adding the ground plane 21, a voltage of the ground plane 21 is different from common mode voltages of common mode signals transmitted over all first differential wires 31 and common mode voltages of common mode signals transmitted over all second differential wires 32. Therefore, the common mode signals transmitted over all first differential wires 31 and the common mode signals transmitted over all second differential wires 32 may use the ground plane 21 as a reference, and the ground plane 21 forms capacitance with all first differential wires 31 and all second differential wires 32, respectively. Alternating current common mode signals may be coupled based on the capacitance, I=C*(dv/dt). All first differential wires 31 and all second differential wires 32 may also couple some common mode signals to parts (dashed lines with arrows pointing from the first differential wires to the ground plane in FIG. 6) of the ground plane 21 overlapping with the first differential wires 31 and the second differential wires 32 in the form of a current while transmitting first differential signals, second differential signals, and common mode signals in the X direction. I indicates a current of a common mode signal; C indicates capacitance formed by the first differential wire 31 and the ground plane 21, and capacitance formed by the second differential wire 32 and the ground plane 21; dv indicates a variation in a common mode voltage of the common mode signal; and dt indicates a variation in time.

In a capacitive coupling process, characteristic impedance at all locations of the first part 311 of the first differential wire 31 with respect to the ground plane 21 is the same, and characteristic impedance at all locations of the fourth part 321 of the second differential wire 32 with respect to the ground plane 21 is the same. For the second part 312 of the first differential wire 31 and the fifth part 322 of the second differential wire 32, due to existence of the first hollowed-out portion 211, a part that is of the second part 312 and that is corresponding to the first hollowed-out portion 211 and a part that is of the fifth part 322 and that is corresponding to the first hollowed-out portion 211 cannot form capacitance with the first hollowed-out portion 211, so that parasitic capacitance C of the part that is of the second part 312 and that is corresponding to the first hollowed-out portion 211 is reduced, and parasitic capacitance C of the part that is of the fifth part 322 and that is corresponding to the first hollowed-out portion 211 is reduced. In addition, as shown in FIG. 6, a common mode signal transmitted to the parts that are of the second part 312 and the fifth part 322 and that are corresponding to the first hollowed-out portion 211 cannot be directly coupled to the ground plane 21 in a direction perpendicular to the ground plane 21 with a shortest path, but needs to be bypassed to the first part 311 and the fourth part 321 (bold dashed lines with arrows in FIG. 6) before being coupled to the ground plane 21. In this way, parasitic inductance L of the parts that are of the second part 312 and the fifth part 322 and that are corresponding to the first hollowed-out portion 211 is increased.

It can be learned from a formula $$R = \sqrt{\frac{L}{C}}$$

that, because the parasitic capacitance C is reduced and the parasitic inductance L is increased, characteristic impedance R of the second part 312 and the fifth part 322 with respect to the ground plane 21 is increased compared with characteristic impedance R of the first part 311 and the fourth part 321 with respect to the ground plane 21. As a result, characteristic impedance R of a part that is from the first part 311 to the second part 312 and that is corresponding to the first hollowed-out portion 211 changes abruptly, and characteristic impedance R of a part that is from the fourth part 321 to the fifth part 322 and that is corresponding to the first hollowed-out portion 211 changes abruptly. As shown in FIG. 6, because the characteristic impedance changes abruptly, at least some common mode signals are reflected at parts that are of the first differential wire 31 and the second differential wire 32 and that are corresponding to the first hollowed-out portion 211. That is, at least some common mode signals are transmitted to a part corresponding to the first hollowed-out portion 211 over the first differential wire 31 and the second differential wire 32, and then flow back in a direction opposite to the X direction over the first differential wire 31 and the second differential wire 32. In this way, a quantity of common mode signals transmitted from the second part 312 to the third part 313 is reduced, and a quantity of common mode signals transmitted from the fifth part 322 to the sixth part 323 is reduced. In other words, the common mode signals are attenuated along transmission paths thereof in the X direction, so that impact on the antenna 16 close to the first differential wire 31 and the second differential wire 32 is reduced. In addition, compared with addition of a common mode choke component to a mainboard 12 in the related technology, in this application, a process of attenuating the common mode signal is implemented by forming a first hollowed-out portion on an existing ground plane 21, so as to avoid additional increase of total power consumption, layout area, and design complexity of the mainboard 12.

In some possible implementations, according to this embodiment of this application, a width of the first hollowed-out portion 211 may also be adjusted based on a target frequency or target band of a common mode signal to be attenuated, so as to attenuate a common mode signal at the target frequency or target band. In this application, a width d1 of the first hollowed-out portion 211 may be set to be equal to λ/4 to attenuate the common mode signal at the target frequency to a maximum extent, where λ indicates a wavelength corresponding to a target frequency of a common mode signal to be attenuated or corresponding to a center frequency (or another frequency value in a target band) of the target band where the common mode signal to be attenuated is located. When a target frequency f and a wave velocity v of a common mode signal to be attenuated are known, a wavelength of the common mode signal to be attenuated may be obtained according to a formula λ=v/f, so as to determine the width of the first hollowed-out portion 211. The width d1 of the first hollowed-out portion 211 is proportional to the wavelength λ of the common mode signal to be attenuated. When the wave velocity v is constant, the wavelength $\lambda$, of the common mode signal to be attenuated is inversely proportional to the target frequency f of the common mode signal to be attenuated. Therefore, when the wave velocity v is constant, the width d1 of the first hollowed-out portion 211 is inversely proportional to the target frequency f of the common mode signal to be attenuated. In other words, a smaller width d1 of the first hollowed-out portion 211 indicates a higher target frequency f of the common mode signal to be attenuated.

For example, an electromagnetic signal transmitted by the antenna 16 has a target frequency of 6.15 GHz, and therefore common mode signals with the target frequency f of 6.15 GHz should be attenuated in a solution of this application, a wave velocity v of the common mode signals is $3*10^8$ m/s, and $$d1 = \frac{v}{4f} = \frac{3*10^8 \text{ m/s}}{4*6.15 \text{ GHz}}$$

is obtained according to formulas $\lambda=v/f$ and $d1=\lambda/4$.

It should be noted herein that, to meet the requirement that the first differential wire 31 and the second differential wire 32 couple common mode signals to the ground plane 21 in the form of a current, enough metal should be reserved in parts that are of the ground plane 21 and that are directly opposite to the first differential wire 31 and the second differential wire 32. Therefore, the width d1 of the first hollowed-out portion 211 cannot be infinitely large, and a target frequency of common mode signals that can be attenuated cannot be infinitely small. Therefore, the abrupt change in characteristic impedance caused by the first hollowed-out portion 211 may be used to attenuate common mode signals at a higher frequency.

In addition, in some possible implementations, a quantity of the first hollowed-out portion 211 is not limited in this embodiment of this application, provided that the orthographic projection of the first hollowed-out portion 211 on the signal layer overlaps with the second part 312 and the fifth part 322 to implement the abrupt change in characteristic impedance of the part that is of the second part 312 and is corresponding to the first hollowed-out portion 211 and the part that is of the fifth part 322 and is corresponding to the first hollowed-out portion 211 with respect to the ground plane 21.

In some possible implementations, as described above, the orthographic projection of the first hollowed-out portion 211 on the signal layer may completely cover the second part 312 and the fifth part 322 (FIG. 2a), or the orthographic projection of the first hollowed-out portion 211 on the signal layer covers a part of the second part 312 and a part of the fifth part 322 (FIG. 2b). Optionally, compared with a situation in which the orthographic projection of the first hollowed-out portion 211 on the signal layer covers a part of the second part 312 and a part of the fifth part 322, in this embodiment of this application, when the orthographic projection of the first hollowed-out portion 211 on the signal layer completely covers the second part 312 and the fifth part 322, characteristic impedance R of the second part 312 and the fifth part 322 with respect to the ground plane 21 may be increased, so that more common mode signals can flow back over the first differential wire 31 and the second differential wire 32 in the direction opposite to the X direction to attenuate common mode signals at a target frequency or target band to a greater extent.

Figure 7:
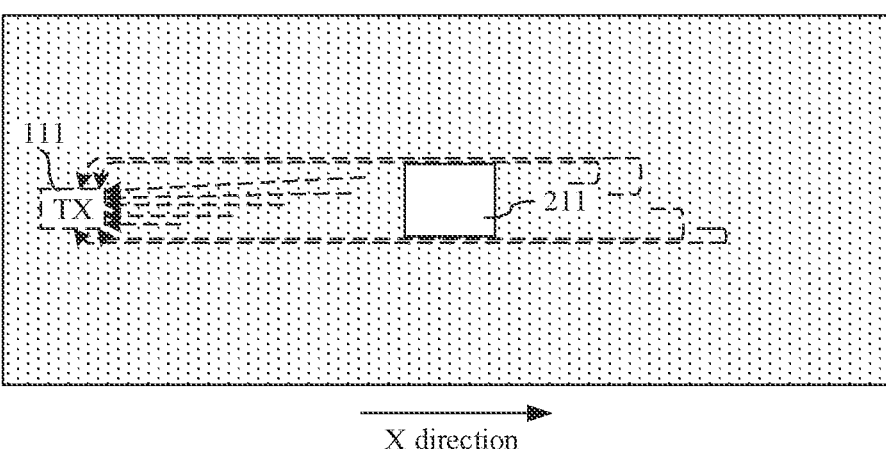
FIG. 7 is a diagram showing an example of a transmission path for common mode signals coupled to aground plane.

Further, as shown in FIG. 5, after the first differential wire 31 and the second differential wire 32 couple at least some common mode signals to the ground plane 21 in the form of a current, the common mode signals coupled to the ground plane 21 can flow back to a ground terminal of the transmitting circuit 111 of the camera 11, so that the camera 11, the first differential wire 31, the second differential wire 32, and the ground plane 21 form a loop path. As shown in FIG. 7, common mode signals coupled to the ground plane 21 may flow back to the ground terminal of the transmitting circuit 111 along a path with minimum inductance.

For first differential signals and second differential signals, a first differential voltage of a first differential signal and a second differential voltage of a second differential signal in a set of differential signals are different, and the first differential voltage and the second differential voltage may refer to each other. Therefore, first differential signals transmitted over all first differential wires 31 and second differential signals transmitted over all second differential wires 32 have a weak impact on the ground plane 21, and the first differential signals and the second differential signals are less affected by the first hollowed-out portion 211. The first differential wires 31 and the second differential wires 32 can still transmit differential signals to the SoC 121 normally without affecting normal functions of the camera 11.

In addition, in the foregoing example, that the circuit board includes a set of differential wires is used as an example to describe a positional relationship between the first hollowed-out portion 211 and a first differential wire 31 and a second differential wire 32. In some possible implementations, when the circuit board includes a plurality of sets of differential wires, a quantity of the first hollowed-out portion 211 may be one or more, provided that the orthogonal projection of the first hollowed-out portion 211 on the signal layer overlaps with the second part 312 and the fifth part 322.

In another embodiment, as shown in FIG. 8 to FIG. 11, based on the structure of the circuit board according to the foregoing embodiment, the ground plane 21 is further provided with a second hollowed-out portion 212 and a third hollowed-out portion 213. An orthographic projection of the second hollowed-out portion 212 on the signal layer is located on one side that is of the first differential wire 31 and that is away from the second differential wire 32; and an orthographic projection of the third hollowed-out portion 213 on the signal layer is located on one side that is of the second differential wire 32 and that is away from the first differential wire 31. In addition, in the ground plane 21, the second hollowed-out portion 212, the third hollowed-out portion 213, and the first hollowed-out portion 211 are a continuous through hole, and the through hole may penetrate through the ground plane 21. An extension direction of the second hollowed-out portion 212 is the same as that of the first differential wire 31, and an extension direction of the third hollowed-out portion 213 is the same as that of the second differential wire 32.

Figure 8:
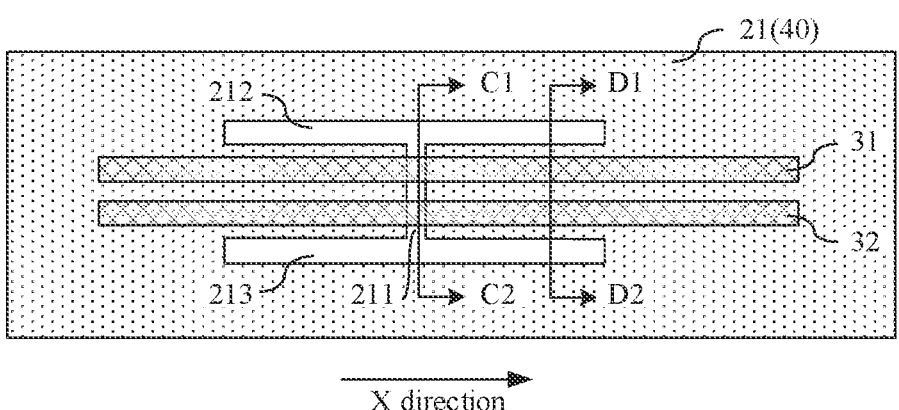
FIG. 8 is a top view of still another circuit board according to an embodiment of this application.
Figure 9:
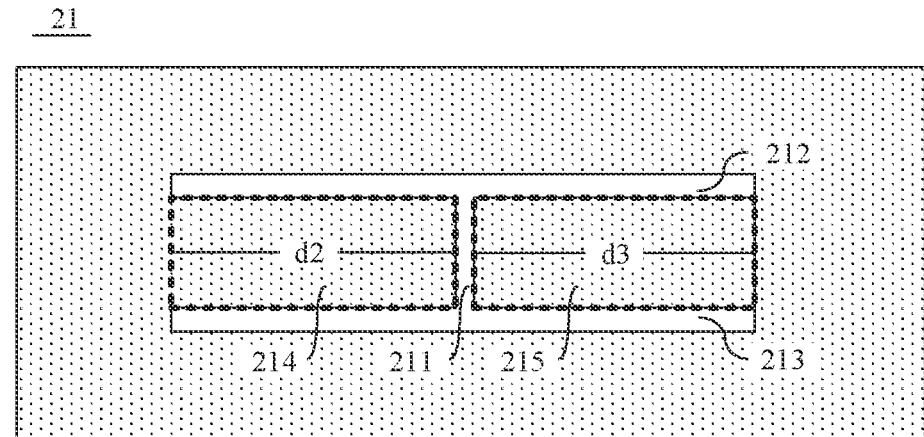
FIG. 9 is a top view of still another circuit board according to an embodiment of this application.
Figure 10:
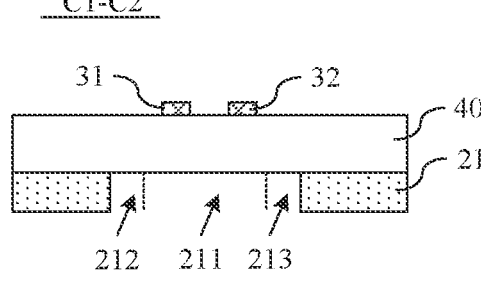
FIG. 10 is a schematic sectional view taken along a C1-C2 direction in FIG. 8.
Figure 11:
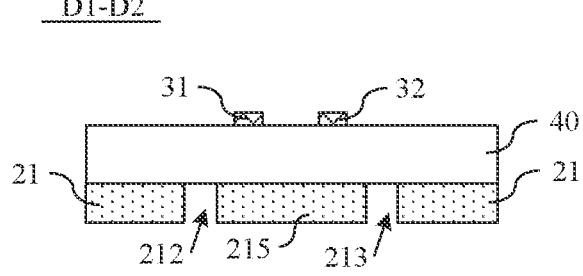
FIG. 11 is a schematic sectional view taken along a D1-D2 direction in FIG. 8.

As shown in FIG. 9, a part that is of the ground plane 21 and that is located between the second hollowed-out portion 212 and the third hollowed-out portion 213 is a branch, and in the branch, a part located on one side of the first hollowed-out portion 211 is a first branch 214, and a part located on the other side of the first hollowed-out portion 212 is a second branch 215. As shown in FIG. 8, on the basis that the orthographic projection of the first hollowed-out portion on the signal layer completely overlaps with the second part 312 and the fifth part 322, an orthographic projection of the first branch 214 on the signal layer completely overlaps with the first part 311 and the fourth part 321, and an orthographic projection of the second branch 215 on the signal layer completely overlaps with the third part 313 and the sixth part 323. In other words, the orthographic projections of the second hollowed-out portion 212 and the third hollowed-out portion 213 on the signal layer do not overlap with the first differential wire 31 and the second differential wire 32. In some possible implementations, in a vertical direction between the first differential wire 31 and the second differential wire 32, edges of an area where orthographic projections of the first branch 214 and the second branch 215 on the signal layer are located go beyond edges of the first differential wire 31 and the second differential wire 32, so as to avoid overlapping areas between orthographic projections of the second hollowed-out portion 212 and the third hollowed-out portion 213 on the signal layer and the first differential wire 31 and the second differential wire 32 due to an alignment error in a process.

Figure 12:
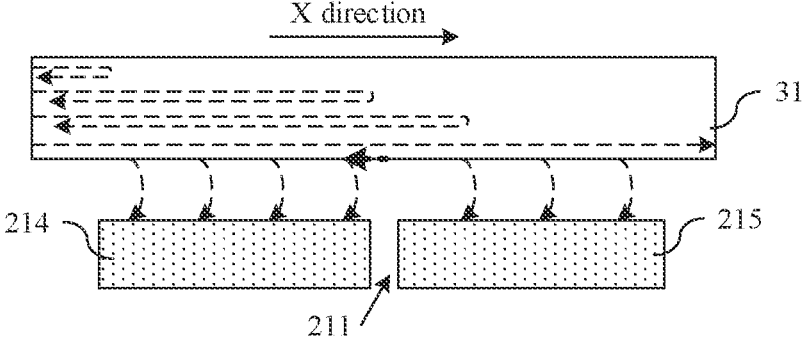
FIG. 12 is a schematic diagram of an example of common mode signals coupled from a signal layer to a ground plane.

Based on the structure in this embodiment, that the camera 11 sends differential signals to the SoC 121 is still used as an example, during transmission of common mode signals in the first differential wire 31 and the second differential wire 32, the first differential wire 31 and the second differential wire 32 may also couple the common mode signals to parts (dashed lines with arrows pointing from the first differential wire to the ground plane in FIG. 12) that are of the ground plane 21 and that overlap with the first differential wire 31 and the second differential wire 32 in the form of a current.

In a capacitive coupling process, characteristic impedance R of a part that is of the first part 311 of the first differential wire 31 and that is directly opposite to the first branch 214 with respect to the ground plane 21 is the same, and characteristic impedance R of a part that is of the second part 312 of the second differential wire 32 and that is directly opposite to the first branch 214 with respect to the ground plane 21 is the same. When the ground plane 21 does not include a second hollowed-out area 212 and a third hollowed-out area 213, after coupling from the first differential wire 31 and the second differential wire 32 to areas that are of the ground plane 21 and that are directly opposite to the first differential wire 31 and the second differential wire 32, parts that are of the ground plane 21 and that are directly opposite to the first differential wire 31 and the second differential wire 32 will also couple some alternating current common mode signals to a part that is of the ground plane 21 and that is adjacent to the signal layer in the form of a current based on a capacitive coupling effect.

However, due to existence of the second hollowed-out area 212 and the third hollowed-out area 213, after receiving common mode signals coupled by the first differential wire 31 and the second differential wire 32, parts that are of the ground plane 21 and that are directly opposite to the first differential wire 31 and the second differential wire 32 can no longer couple alternating current common mode signals to a part that is of the ground plane 21 and that is adjacent to the signal layer in the form of a current based on a capacitive coupling effect, so that parasitic capacitance of the first part 311 and the fourth part 321 with respect to the ground plane 21 is reduced. In addition, compared with a situation in which the ground plane 21 does not include the second hollowed-out portion 212 and the third hollowed-out portion 213, common mode signals transmitted along side faces of the first differential wire 31 and the second differential wire 32 cannot be fully coupled to the ground plane 21 due to existence of the second hollowed-out portion 212 and the third hollowed-out portion 213. In other words, due to existence of the second hollowed-out portion 212 and the third hollowed-out portion 213, a coupling area between the first differential wire 31 and the second differential wire 32 and the ground plane 21 is reduced. As the coupling area between the first differential wire 31 and the second differential wire 32 and the ground plane 21 is reduced, parasitic capacitance C of the first part 311 and the fourth part 321 with respect to the ground plane 21 is also reduced. The side faces of the first differential wire 31 and the second differential wire 32 are two opposite surfaces of the first differential wire 31 and two opposite surfaces of the second differential wire 32 in a vertical direction from the first differential wire 31 to the second differential wire 32. The coupling area between each of the first differential wire 31 and the second differential wire 32 and the ground plane 21 is an area of capacitance formed between each of the first differential wire 31 and the second differential wire 32 and the ground plane 21.

As shown in FIG. 12, it can be learned from a formula $$R = \sqrt{\frac{L}{C}}$$

that, because parasitic capacitance C of the first part 311 and the fourth part 321 at the second hollowed-out portion 212 and the third hollowed-out portion 213 with respect to the ground plane 23 is reduced, characteristic impedance R of parts that are of the first part 311 and the fourth part 321 and that are directly opposite to the first branch 214 is increased, resulting in an abrupt change in characteristic impedance of parts that are of the first part 311 and the fourth part 321 and that are directly opposite to the first branch 214. At least some common mode signals are transmitted to the parts directly opposite to the first branch 214 over the first differential wire 31 and the second differential wire 32, and then flow back in a direction opposite to the X direction over the first differential wire 31 and the second differential wire 32. In this way, a quantity of common mode signals transmitted from the first part 311 to the second part 312 is reduced, and a quantity of common mode signals transmitted from the fourth part 321 to the fifth part 322 is reduced. In other words, the common mode signals are attenuated along transmission paths thereof in the X direction, so that impact on the antenna 16 close to the first differential wire 31 and the second differential wire 32 is reduced.

Still referring to FIG. 12, common mode signals that do not flow back in the first part 311 and the fourth part 321 may be further transmitted to the second part 312 and the fifth part 322 in the X direction over the first differential wire 31 and the second differential wire 32. However, based on analysis in the foregoing embodiment, at least some common mode signals that do not flow back in the first part 311 and the fourth part 321 are reflected at parts that are of the first differential wire 31 and the second differential wire 32 and that are corresponding to the first hollowed-out portion 211. That is, at least some common mode signals that do not flow back in the first part 311 and the fourth part 321 are transmitted to a part corresponding to the first hollowed-out portion 211 over the first differential wire 31 and the second differential wire 32, and then flow back in the direction opposite to the X direction over the first differential wire 31 and the second differential wire 32. In this way, a quantity of common mode signals transmitted from the second part 312 to the third part 313 is reduced, and a quantity of common mode signals transmitted from the fifth part 322 to the sixth part 323 is reduced. In other words, the common mode signals are attenuated along transmission paths thereof in the X direction, so that impact on the antenna 16 close to the first differential wire 31 and the second differential wire 32 is reduced.

Still referring to FIG. 12, common mode signals that do not flow back in the first part 311, the second part 312, the fourth part 321 and the fifth part 322 may be further transmitted to the third part 313 and the sixth part 323 in the X direction over the first differential wire 31 and the second differential wire 32. However, due to existence of the second hollowed-out portion 212 and the third hollowed-out portion, at least some common mode signals that do not flow back in the first part 311, the second part 312, the fourth part 321 and the fifth part 322 are transmitted to a part directly opposite to the second branch 215 over the first differential wire 31 and the second differential wire 32, and then flow back over the first differential wire 31 and the second differential wire 32 in the direction opposite to the X direction. In this way, a quantity of common mode signals transmitted from the third part 313 and the sixth part 323 to the SoC 121 is reduced. In other words, the common mode signals are attenuated along transmission paths thereof in the X direction, so that impact on the antenna 16 close to the first differential wire 31 and the second differential wire 32 is reduced.

Further, compared with a situation in which the ground plane 21 does not include the second hollowed-out portion 212 and the third hollowed-out portion 213, in a process in which at least some common mode signals flow back (including common mode signals that flow back due to the first hollowed-out portion, the second hollowed-out portion, and the third hollowed-out portion) in the direction opposite to the X direction over the first differential wire 31 and the second differential wire 32, due to existence of the second hollowed-out portion 212 and the third hollowed-out portion 213, an area of an electric field between side faces of the first differential wire 31 and the second differential wire 32 and the ground plane 21 is reduced, and parasitic inductance L at the first part 311 and the fourth part 321 is increased. According to a formula $$R = \sqrt{\frac{L}{C}},$$

due to a reduction in a backflow area, the parasitic inductance L is increased, characteristic impedance R of parts that are of the first part 311 and the fourth part 321 and that are directly opposite to the first branch 214 is further increased, and characteristic impedance R of parts that are of the third part 313 and the sixth part 323 and that are directly opposite to the second branch 215 is further increased, so that more common mode signals are reflected and flow back in the direction opposite to the X direction. In this way, a quantity of common mode signals transmitted to ends of the first differential wire 31 and the second differential wire 32 in the X direction is further reduced, and impact on the antenna 16 close to the first differential wire 31 and the second differential wire 32 is further reduced.

In addition, compared with the foregoing solution in which the ground plane 21 includes the first hollowed-out portion 211, but does not include the second hollowed-out portion 212 and the third hollowed-out portion 213, the solution in which the ground plane 21 includes the first hollowed-out portion 211, the second hollowed-out portion

212, and the third hollowed-out portion 213 in this embodiment of this application can extend lengths of parts that are of the first differential wire 31 and the second differential wire 32 and that have abrupt changes in characteristic impedance, so that more common mode signals can be reflected. In other words, more common mode signals can flow back over the first differential wire 31 and the second differential wire 32 in the direction opposite to the X direction. In this way, a quantity of common mode signals transmitted from the first part 311 and the second part 312 to the third part 313 is reduced, and a quantity of common mode signals transmitted from the fourth part 321 and the fifth part 322 to the sixth part 323 is reduced. In other words, the common mode signals may be further attenuated along transmission paths thereof in the X direction, so that impact on the antenna 16 close to the first differential wire 31 and the second differential wire 32 is reduced.

Figure 13:
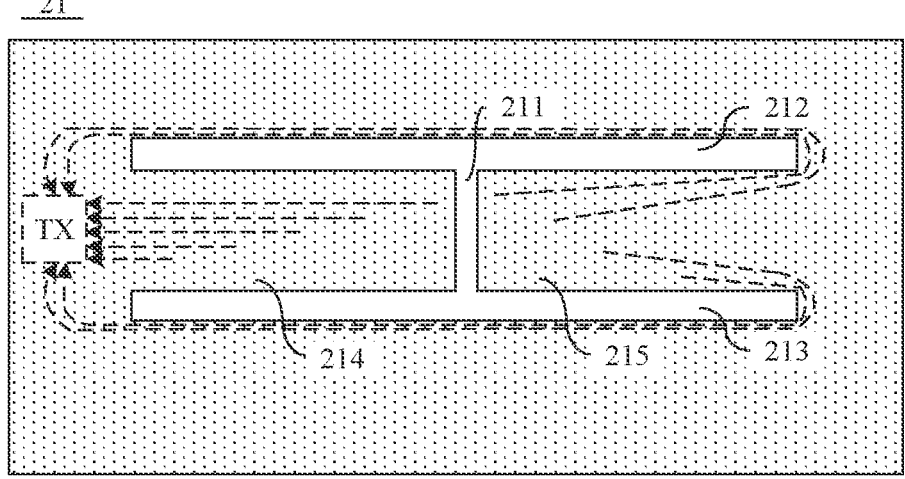
FIG. 13 is a diagram showing an example of a transmission path for common mode signals coupled to a ground plane.

Further, as shown in FIG. 13, common mode signals coupled to the first branch 214 and the second branch 215 at the ground plane 21 in the form of a current may flow back to the ground terminal of the transmitting circuit 111 along a path with minimum inductance. In other words, the common mode signals coupled to the first branch 214 at the ground plane 21 in the form of a current flow back to the ground terminal of the transmitting circuit 111 in the direction opposite to the X direction; and the common mode signals coupled to the second branch 215 at the ground plane 21 in the form of a current flow in the X direction to edges that are of the second hollowed-out portion 212 and the third hollowed-out portion 213 at the ground plane 21 and that are away from the first branch 214, and then flow close to the edges of the second hollowed-out portion 212 and the third hollowed-out portion 213 back to the ground terminal of the transmitting circuit 111 in the direction opposite to the X direction.

For first differential signals and second differential signals, a first differential voltage of a first differential signal and a second differential voltage of a second differential signal in a set of differential signals are different, and the first differential voltage and the second differential voltage may refer to each other. Therefore, first differential signals transmitted over all first differential wires 31 and second differential signals transmitted over all second differential wires 32 have a weak impact on the ground plane 21, and the first differential signals and the second differential signals are less affected by the first hollowed-out portion 211. The first differential wires 31 and the second differential wires 32 can still transmit differential signals to the SoC 121 normally without affecting normal functions of the camera 11.

In addition, in some possible implementations, according to this embodiment of this application, a length d2 of the first branch 214 and a length d3 of the second branch 215 may also be adjusted based on a target frequency or target band to be attenuated, so as to attenuate a common mode signal at the target frequency or target band. A length of the first branch 214 is an actual length from an edge away from the second branch 215 to the first hollowed-out portion 211 in an intersection surface between the first branch 214 and the second hollowed-out portion 212; and an actual length from an edge away from the second branch 215 to the first hollowed-out portion 211 in an intersection surface between the first branch 214 and the third hollowed-out portion 212.

In this application, the length d2 of the first branch 214 may be set to be equal to λ/4, and the length d3 of the second branch 215 may be set to be equal λ/4, so as to attenuate common mode signals at a target frequency or target band over the first differential wire 31 and the second differential wire to a maximum extent. Using a length of the first branch 214 as an example, when a target frequency f and a wave velocity v of a common mode signal to be attenuated are known, a wavelength of the common mode signal to be attenuated may be obtained according to a formula λ=v/f, so as to determine the length d2 of the first branch 214. The length d2 of the first branch 214 is proportional to the wavelength λ of the common mode signal to be attenuated. When the wave velocity v is constant, the wavelength λ of the common mode signal to be attenuated is inversely proportional to the target frequency f of the common mode signal to be attenuated. Therefore, when the wave velocity v is constant, the length d2 of the first branch 214 is inversely proportional to the target frequency f of the common mode signal to be attenuated. In other words, a smaller length d2 of the first branch 214 indicates a higher target frequency f of the common mode signal to be attenuated.

For example, an electromagnetic signal transmitted by the antenna 16 has a target frequency of 4.975 GHz, so that common mode signals with the target frequency f of 4.975 GHz should be attenuated in a solution of this application, a wave velocity v of the common mode signals is $3*10^8$ m/s, and $$d2 = \frac{v}{4f} = \frac{3*10^8 \text{ m/s}}{4*4.975 \text{ GHz}}$$

is obtained according to formulas λ=v/f and d2=λ/4. A relationship between the length d3 of the second branch 215 and the target frequency of the common mode signal to be attenuated is the same as that between the length d2 of the first branch 214 and the target frequency of the common mode signal to be attenuated. Details are not described herein again. In addition, based on the target frequency of the common mode signal to be attenuated, the length d2 of the first branch 214 and the length d3 of the second branch 215 may be the same.

It should be noted herein that, compared with the solution in which the ground plane 21 includes the first hollowed-out portion 211, but does not include the second hollowed-out portion 212 and the third hollowed-out portion 213, in the solution in which the ground plane 21 includes the first hollowed-out portion 211, the second hollowed-out portion 212 and the third hollowed-out portion 213 in this embodiment, the length d2 of the first branch 214 and the length d3 of the second branch 215 may be set with larger values, and the length d2 of the first branch 214 and the length d3 of the second branch 215 may be larger than the width d1 of the first hollowed-out portion 211. Therefore, the solution of this application can attenuate a common mode signal at a lower frequency.

Specifically, as shown in FIG. 9, shapes of the orthographic projections of the first branch 214 and the second branch 215 on the signal layer may be rectangles, and sizes of the rectangles may be increased or reduced in the X direction based on a target frequency or target band of a common mode signal to be filtered, so as to increase or reduce the length d2 of the first branch 214 and the length d3 of the second branch 215. Certainly, the first branch 214 and the second branch 215 may also have other shapes. In this application, the shapes of the first branch 214 and the second branch 215 may also be adjusted by changing shapes of the second hollowed-out portion 212 and the third hollowed-out portion 213, so that the length d2 of the first branch 214 and the length d3 of the second branch 215 can be adjusted to filter out common mode signals at different frequencies or bands.

Figures 14A, 14B:
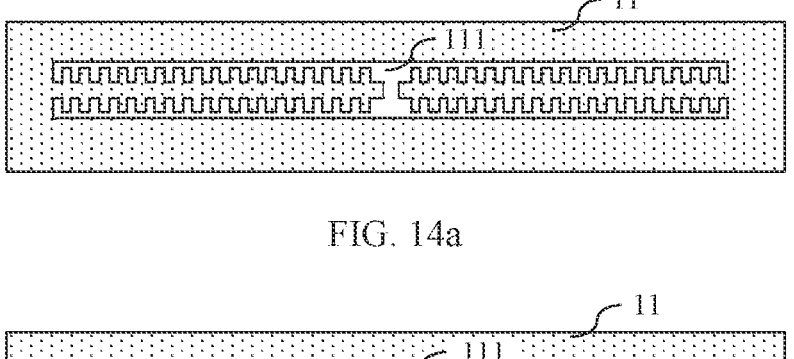
FIG. 14a is a top view of still another circuit board according to an embodiment of this application.
FIG. 14b is a top view of still another circuit board according to an embodiment of this application.

For example, as shown in FIG. 14*a* and FIG. 14*b*, the first branch 214 and the second branch 215 further include protrusions, and the protrusions protrude in a vertical direction between the first differential wire 31 and the second differential wire. In this way, compared with a solution in which the first branch 214 and the second branch 215 do not include the protrusions, the length d2 of the first branch 214 and the length d3 of the second branch 215 may be increased without changing a vertical distance between the first branch 214 and the first hollowed-out portion 211 or a vertical distance between the second branch 215 and the first hollowed-out portion 211, so that a common mode signal at a lower frequency or band can be attenuated. FIG. 14*a* and FIG. 14*b* show examples of rectangular protrusions and arch-shaped protrusions, respectively. Certainly, the protrusions may also have other shapes, which is not limited in this embodiment of this application.

In some possible implementations, if the shapes of the orthographic projections of the first branch 214 and the second branch 215 on the signal layer are rectangles, a common mode signal that has a target frequency of 6.15 GHz and that is filtered by using the solution in which this application includes the first hollowed-out portion 211, the second hollowed-out portion 212, and the third hollowed-out portion 213 may be used; and if the first branch 214 and the second branch 215 further include protrusions, a common mode signal that has a target frequency of 4.975 GHz and that is filtered by using the solution of this application may be used.

Figure 15:
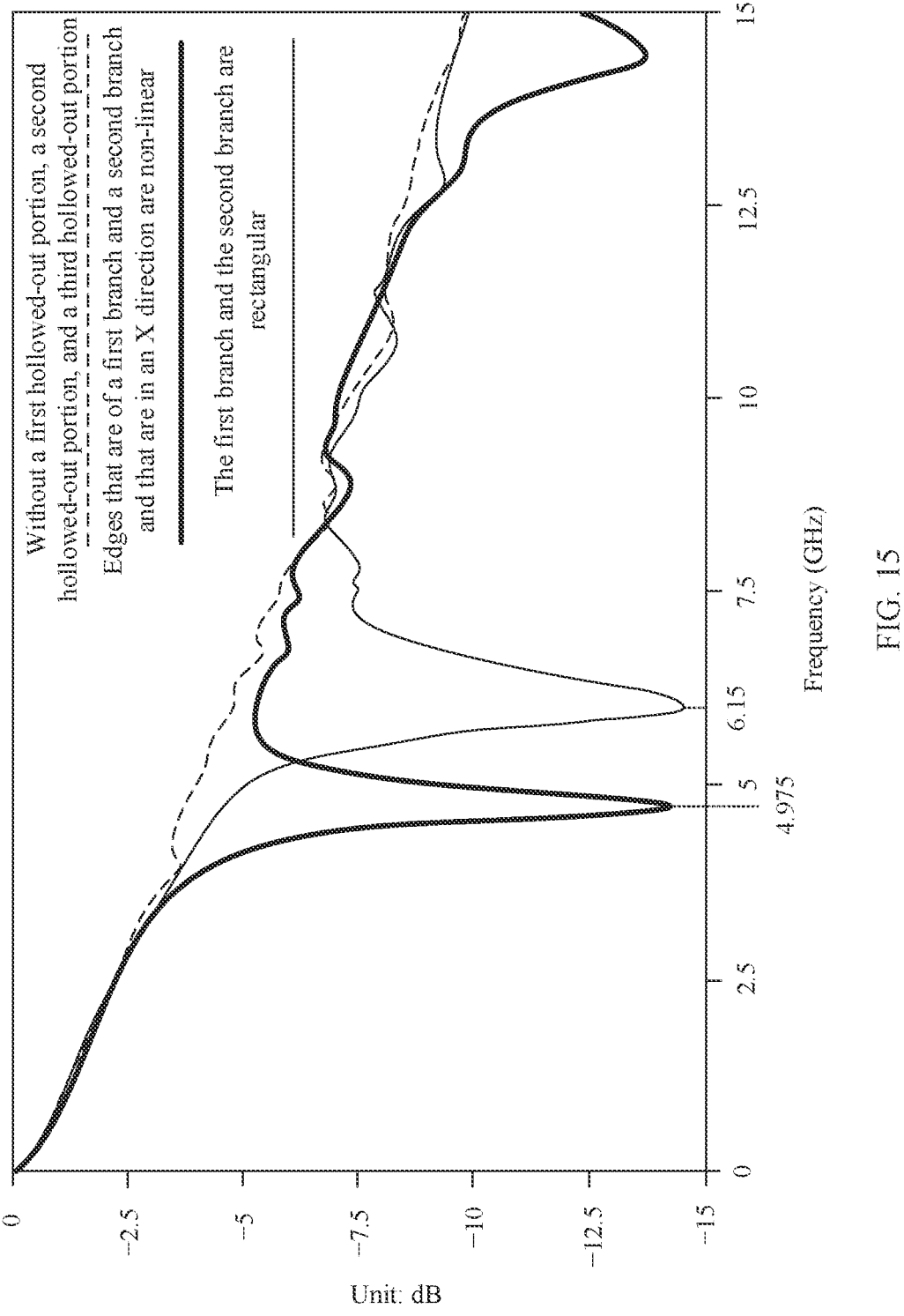
FIG. 15 is a diagram showing an example of simulation of attenuation of a common mode signal at a target frequency by using a circuit board according to this application.
Figure 16:
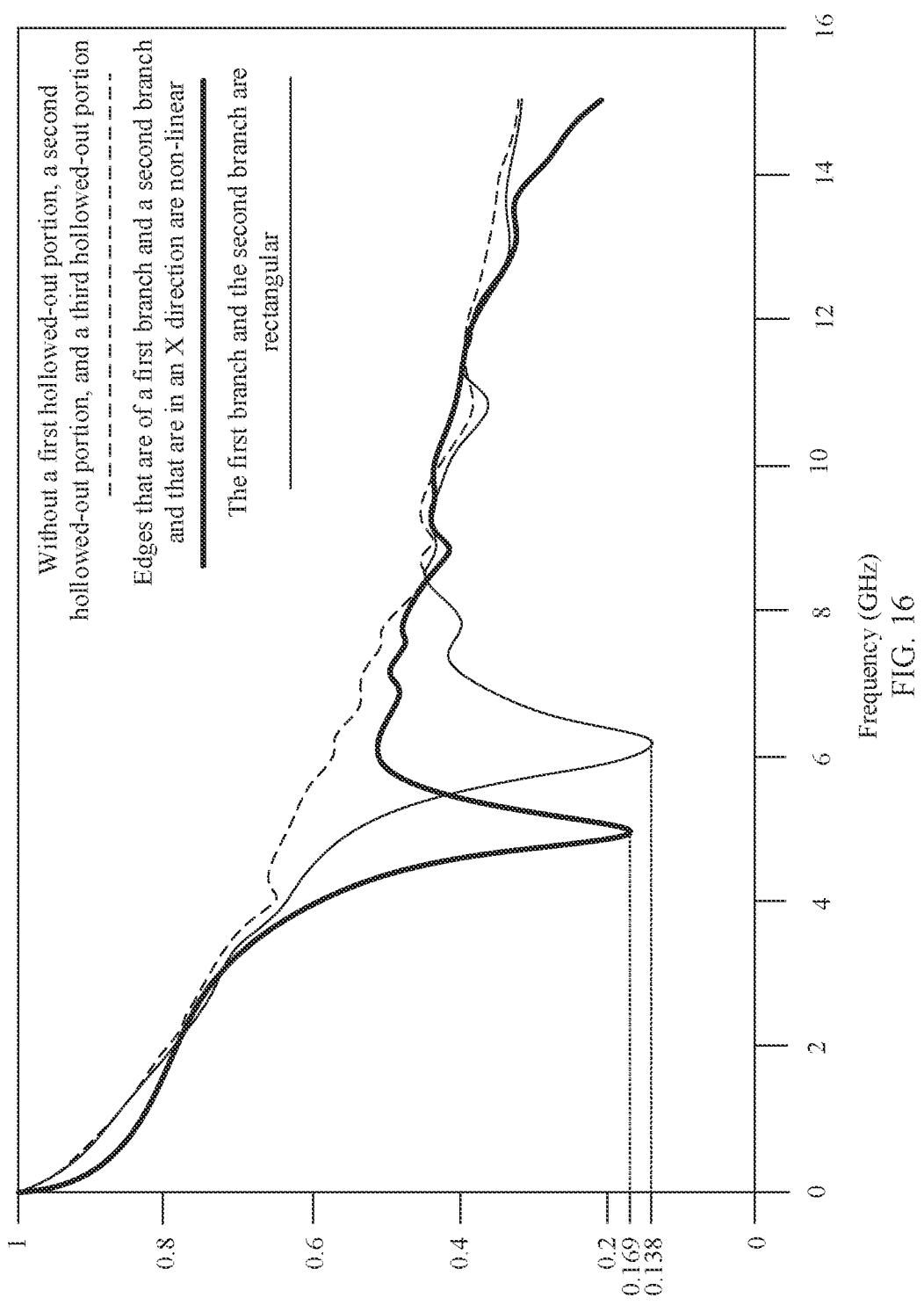
FIG. 16 is a diagram showing an example of simulation of attenuation of a common mode signal at a target frequency by using a circuit board according to this application.

FIG. 15 and FIG. 16 are diagrams showing simulation of attenuation of common mode signals at target frequencies of 4.975 GHz and 6.15 GHz by using a solution of this application. In FIG. 15, a horizontal coordinate indicates frequencies of common mode signals, and a vertical coordinate indicates common mode insertion loss indexes. A common mode insertion loss index is 20 lg(x2/x1)dB, where x2/x1 indicates a common mode insertion loss, that is, a ratio of a common mode signal at a target frequency after attenuation to that before attenuation. In FIG. 16, a horizontal coordinate indicates frequencies of common mode signals, and a vertical coordinate indicates common mode insertion losses. For example, for a 4.975 GHz common mode signal, a common mode index thereof is 0.169, and a common mode insertion loss index is 20 lg0.169; or for a 6.15 GHz common mode signal, a common mode index thereof is 0.138, and a common mode insertion loss index is 20 lg0.138.

In addition, for a preparation process for the ground plane 21 according to any one of the foregoing embodiments, a metal layer and a photoresist may be deposited sequentially; then the photoresist is exposed and developed to form a photoresist pattern; and then the metal layer is etched by using a mask (mask) under the protection of the photoresist pattern, so as to obtain the ground plane 21 including the first hollowed-out portion 211 (or including the first hollowed-out portion 211, the second hollowed-out portion 212, and the third hollowed-out portion 213). Certainly, the ground plane 21 according to this application may also be prepared by using another process, which is not limited in this embodiment of this application.

Figure 17:
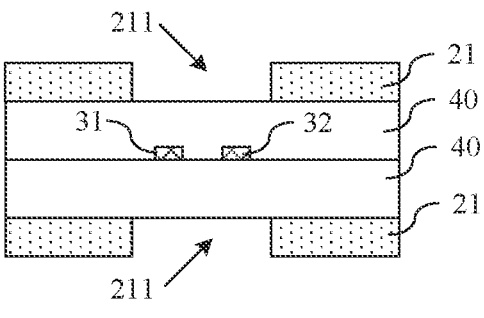
FIG. 17 is a side view of a circuit board according to an embodiment of this application.

The foregoing example illustrates that a quantity of the ground plane 21 is one, and the ground plane 21 is disposed on one side of the signal layer. Certainly, as shown in FIG. 17, a quantity of the ground plane 21 may also be two, and the two ground planes 21 are respectively disposed on opposite sides of the signal layer. For a positional relationship between each of the two ground planes 21 and the signal layer, refer to a positional relationship between the one ground plane 21 according to any one of the foregoing embodiments and the signal layer, and details are not described herein again. Compared with one ground plane 21, the two ground planes 21 according to the foregoing embodiment are used in this embodiment of this application to further attenuate a common mode signal at a target frequency or target band, so as to further reduce impact on the antenna 16 close to the first differential wire 31 and the second differential wire 32.

In addition, in the foregoing example, that the circuit board includes a set of differential wires is used as an example to describe a positional relationship between each of the second hollowed-out portion 212 and the third hollowed-out portion 213 and each of a first differential wire 31 and a second differential wire 32. In some possible implementations, when the circuit board includes a plurality of sets of differential wires, orthographic projections of the second hollowed-out portion 212 and the third hollowed-out portion 213 on the signal layer may be respectively disposed on opposite sides of each set of differential wires. In other words, when the circuit board includes a plurality of sets of differential wires, a quantity of the second hollowed-out portion 212 and the third hollowed-out portion 213 is the same as that of the first differential wire 31 and the second differential wire 32. Within each set of differential wires, an orthographic projection of a second hollowed-out portion 212 on the signal layer is located on one side that is of the first differential wire 31 and that is away from the second differential wire 32; and an orthographic projection of a third hollowed-out portion 213 on the signal layer is located on one side that is of the second differential wire 32 and that is away from the first differential wire 31.

The foregoing embodiments are merely used to describe the technical solutions of this application, but are not limited thereto. Although this application is described in detail with reference to the foregoing embodiments, a person of ordinary skill in the art should understand that the foregoing embodiments may still modify the technical solutions described in the foregoing embodiments, or perform equivalent replacement on some of the technical features. However, these modifications or replacements do not leave the essence of the corresponding technical solutions out of the scope of the technical solutions in the embodiments of this application.

What is claimed is:

1. A circuit board, comprising:
a signal layer, wherein the signal layer comprises at least one set of differential wires, and the at least one set of differential wires comprises a first differential wire and a second differential wire that are insulated from each other, the first differential wire comprises a first part, a second part, and a third part that are arranged successively in an extension direction of the first differential wire; and the second differential wire comprises a fourth part, a fifth part, and a sixth part that are arranged successively in an extension direction of the second differential wire; and
a ground plane, wherein the ground plane is disposed on at least one side of the signal layer, and is insulated from the signal layer; and the ground plane is provided with a first hollowed-out portion, and an orthographic projection of the first hollowed-out portion on the signal layer overlaps with the second part and the fifth part, wherein the ground plane is enclosed by the first hollowed-out portion into a first branch and a second branch, the first branch and the second branch are respectively disposed on opposite sides of the first hollowed-out portion, and the first branch and the second branch comprise protrusions that protrude in a vertical direction between the first differential wire and the second differential wire.

2. The circuit board according to claim 1, wherein a width of the first hollowed-out portion is a ratio of a wavelength at a target frequency to 4 in the extension direction of the first differential wire and the extension direction of the second differential wire, and the target frequency is a frequency of a common mode signal attenuated by the circuit board.

3. The circuit board according to claim 1, wherein the orthographic projection of the first hollowed-out portion on the signal layer completely overlaps with the second part and the fifth part.

4. The circuit board according to claim 3, wherein the ground plane is further provided with a second hollowed-out portion and a third hollowed-out portion;
an orthographic projection of the second hollowed-out portion on the signal layer is located on one side that is of the first differential wire and that is away from the second differential wire; an orthographic projection of the third hollowed-out portion on the signal layer is located on one side that is of the second differential wire and that is away from the first differential wire; and the first hollowed-out portion, the second hollowed-out portion and the third hollowed-out portion continuously penetrate through the ground plane; and the ground plane is further enclosed by the second hollowed-out portion and the third hollowed-out portion into the first branch and the second branch.

5. The circuit board according to claim 4, wherein an extension direction of the second hollowed-out portion is the same as that of the first differential wire, and an extension direction of the third hollowed-out portion is the same as that of the second differential wire.

6. The circuit board according to claim 4, wherein a length range of the first branch and the second branch is a ratio of a wavelength at a target frequency to 4;
the length of the first branch is a length from an edge that is of the first branch and that is away from the second branch to the first hollowed-out portion, the length of the second branch is a length from an edge that is of the second branch and that is away from the first branch to the first hollowed-out portion, and the target frequency is a frequency of a common mode signal attenuated by the circuit board.

7. The circuit board according to claim 4, wherein in the vertical direction between the first differential wire and the second differential wire, edges of an area where orthographic projections of the first branch and the second branch on the signal layer are located go beyond edges of the first differential wire and the second differential wire.

8. The circuit board according to claim 1, wherein a quantity of the ground plane is two, and the two ground planes are respectively disposed on opposite sides of the signal layer.

9. The circuit board according to claim 1, wherein at least one chip is integrated on the circuit board, and the chip comprises the signal layer.

10. The circuit board according to claim 9, wherein the chip further comprises the ground plane.

* * * * *